United States Patent
Ikeda et al.

(10) Patent No.: US 10,431,724 B2
(45) Date of Patent: Oct. 1, 2019

(54) LIGHT EMITTING DEVICE AND METHOD OF MANUFACTURING SAME

(71) Applicant: NICHIA CORPORATION, Anan-shi, Tokushima (JP)

(72) Inventors: Tadaaki Ikeda, Anan (JP); Toru Hashimoto, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/977,580

(22) Filed: May 11, 2018

(65) Prior Publication Data
US 2018/0331263 A1    Nov. 15, 2018

(30) Foreign Application Priority Data

May 12, 2017 (JP) ................. 2017-096014
Feb. 27, 2018 (JP) ................. 2018-033162

(51) Int. Cl.
| H01L 33/60 | (2010.01) |
| H01L 33/50 | (2010.01) |
| H01L 33/48 | (2010.01) |
| H01L 33/56 | (2010.01) |
| H01L 33/54 | (2010.01) |

(Continued)

(52) U.S. Cl.
CPC ........... *H01L 33/60* (2013.01); *F21V 7/22* (2013.01); *H01L 33/486* (2013.01); *H01L 33/50* (2013.01); *H01L 33/54* (2013.01); *H01L 33/56* (2013.01); *H01L 33/58* (2013.01);

(Continued)

(58) Field of Classification Search
None
See application file for complete search history.

(56) References Cited

U.S. PATENT DOCUMENTS

| 8,753,907 B2 | 6/2014 | Shimomura et al. |
| 9,786,821 B2 | 10/2017 | Hashimoto et al. |

(Continued)

FOREIGN PATENT DOCUMENTS

| JP | 2004327632 A | 11/2004 |
| JP | 2006237557 A | 9/2006 |

(Continued)

*Primary Examiner* — Bilkis Jahan
(74) *Attorney, Agent, or Firm* — Hunton Andrews Kurth LLP

(57) ABSTRACT

A light emitting device includes: a rectangular substrate, a light emitting element, a reflective member disposed at one or more lateral sides of the light emitting element while being away from therefrom, a light guide member, and a light transmissive member on the light guide member. The reflective member includes one or more first reflective members opposing lateral faces of the light emitting element, and a second reflective member outside the first reflective member. The first reflective members have inner lateral faces opposing each other each having an oblique or curved portion slanted so that a distance therebetween increases towards the light transmissive member from a side close to the substrate. The second reflective member covers outer lateral faces of the light transmissive member and the first reflective members, and an upper face of the second reflective member is flush with an upper face of the light transmissive member.

11 Claims, 11 Drawing Sheets

(51) Int. Cl.
*F21V 7/22* (2018.01)
*H01L 33/58* (2010.01)

(52) U.S. Cl.
CPC ............ *H01L 2933/005* (2013.01); *H01L 2933/0033* (2013.01); *H01L 2933/0041* (2013.01)

(56) References Cited

U.S. PATENT DOCUMENTS

| | | | |
|---|---|---|---|
| 9,941,453 | B2 | 4/2018 | Suzuki |
| 2010/0258830 | A1 | 10/2010 | Ide et al. |
| 2011/0309384 | A1 | 12/2011 | Ito et al. |
| 2013/0188381 | A1 | 7/2013 | Kotani |
| 2014/0203305 | A1 | 7/2014 | Kawano et al. |
| 2015/0311405 | A1 | 10/2015 | Oyamada et al. |
| 2016/0081142 | A1 | 3/2016 | Abe et al. |
| 2016/0348876 | A1* | 12/2016 | Azuma ............ B29D 11/0074 |
| 2016/0351765 | A1* | 12/2016 | Suzuki ............ H01L 33/60 |
| 2017/0054062 | A1 | 2/2017 | Tamaki |
| 2017/0110635 | A1 | 4/2017 | Ito |
| 2017/0271565 | A1 | 9/2017 | Abe |

FOREIGN PATENT DOCUMENTS

| | | | |
|---|---|---|---|
| JP | 2007103511 | A | 4/2007 |
| JP | 2012009470 | A | 1/2012 |
| JP | 2013004807 | A | 1/2013 |
| JP | 2013149906 | A | 8/2013 |
| JP | 2013219397 | A | 10/2013 |
| JP | 2014138185 | A | 7/2014 |
| JP | 2016006821 | A | 1/2016 |
| JP | 2016058614 | A | 4/2016 |
| JP | 2016086059 | A | 5/2016 |
| JP | 2016219743 | A | 12/2016 |
| JP | 2016225501 | A | 12/2016 |
| JP | 2017022305 | A | 1/2017 |
| JP | 2017041579 | A | 2/2017 |
| JP | 2017076719 | A | 4/2017 |
| WO | 2009066430 | A1 | 5/2009 |
| WO | 2014091914 | A1 | 6/2014 |

* cited by examiner

LIGHT EMITTING DEVICE AND METHOD OF MANUFACTURING SAME

CROSS-REFERENCE TO RELATED APPLICATION

This application claims priority to Japanese Patent Application No. 2017-096014 filed on May 12, 2017, and Japanese Patent Application No. 2018-033162 filed on Feb. 27, 2018, the disclosures of which are hereby incorporated by reference in their entirety.

BACKGROUND

The present disclosure relates to a light emitting device and a method of manufacturing the light emitting device.

For a light emitting device, for example, Japanese Unexamined Patent Application Publication Nos. 2013-219397 and 2016-219743 each disclose a structure which includes a cover member disposed in the surrounding of a light emitting element.

SUMMARY

With respect to the light emitting devices disclosed in the patent publications mentioned above, however, an increase in the light extraction efficiency is desired.

Accordingly, one object of certain embodiments of the present disclosure is to provide a light emitting device having improved light extraction efficiency and a method of manufacturing such light emitting device.

The light emitting device related to certain embodiment of the present disclosure includes: a substrate in a shape of rectangular; a light emitting element mounted on the substrate; a reflective member disposed at one or more lateral sides of the light emitting element while being away from therefrom; a light guide member filling in the reflective member so as to cover the light emitting element positioned in/between the reflective member; and a light transmissive member disposed on the light guide member. The reflective member includes at least one first reflective member opposite lateral faces of the light emitting element, and a second reflective member positioned outside the first reflective member and surrounds the light emitting element. The first reflective members have inner faces opposite each other, the inner faces each having an oblique or curved portion that are slanted so that a distance therebetween increases towards the light transmissive member from a side close to the substrate. The second reflective member covers the lateral faces of the light transmissive member and outer lateral faces of the first reflective members, and an upper face of the second reflective member is flush with an upper face of the light transmissive member.

The method of manufacturing a light emitting device related to other certain embodiment of the present disclosure includes: arranging a plurality of light emitting elements on a substrate; disposing first reflective members so as to positioned between or surrounding the light emitting elements while being away from the light emitting elements; disposing a light guide member covering the light emitting elements and in contact with the first reflective members; disposing a light transmissive member on the light guide member and the first light reflective members; forming first grooves by partially removing the light transmissive member and the first reflective members; disposing a second reflective member in the first grooves so as to be in contact with the light transmissive member and the first reflective members; and separating into individual pieces by cutting the second reflective member.

According to the light emitting device related to certain embodiment of the present disclosure, the light extraction efficiency can be increased because the space surrounded by the reflective members and the light transmissive member is filled with the light guide member. In addition, the oblique or curved portion of the inner faces of the first reflective members being away from each other allows more light to propagate over a wide expanse of space.

The method of manufacturing a light emitting device related to the embodiment of the present disclosure can manufacture, in a simplified manner, a light emitting device in which the first reflective members have the oblique or curved portion in the inner faces, the second reflective member forms the outer walls of the light emitting device, and the light guide member fills the space that surrounds the light emitting element.

DESCRIPTION

Figure 1:
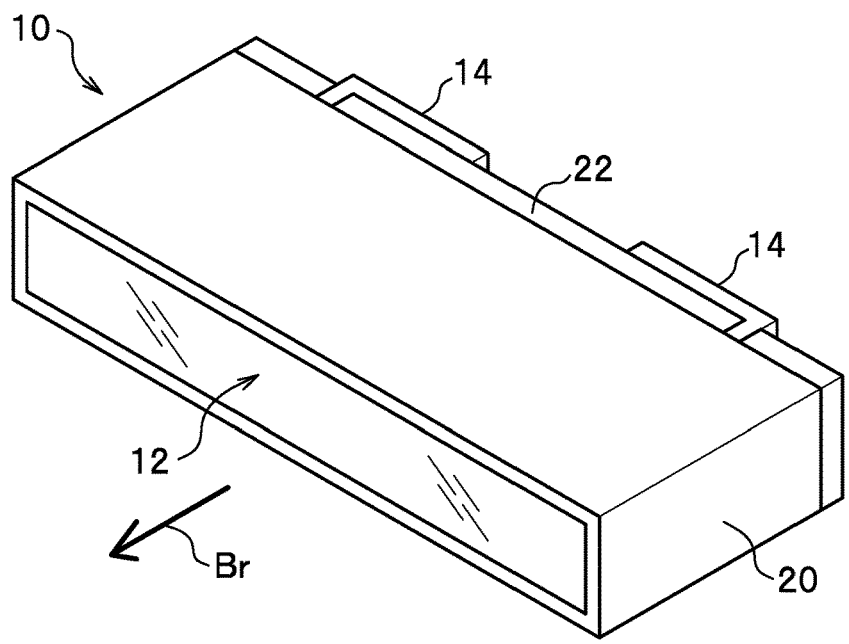
FIG. 1 is a perspective view of a light emitting device according to a first embodiment viewed from the emission face side.
Figure 2:
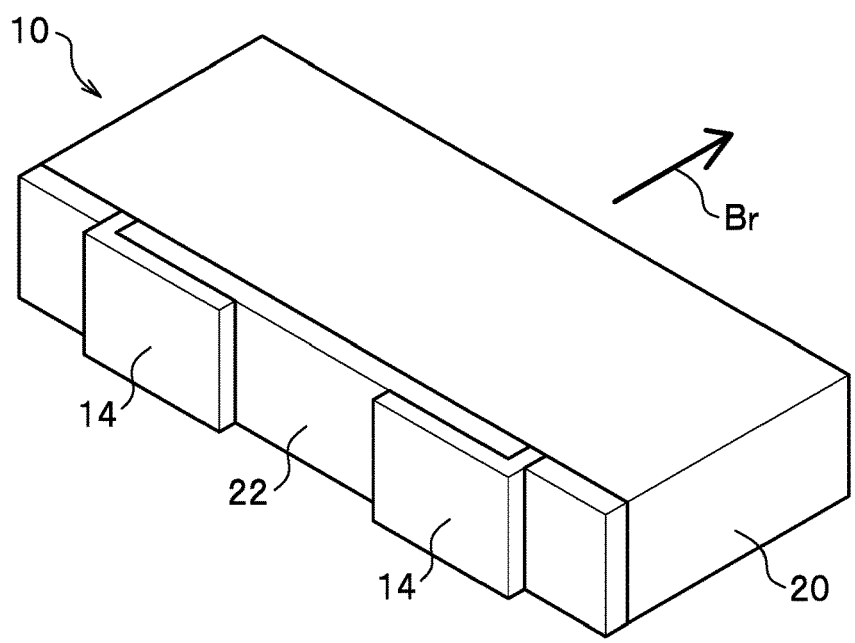
FIG. 2 is a perspective view of a light emitting device according to the first embodiment viewed from the electrode side.

The light emitting device and the method of manufacturing the same related to certain embodiments will be explained below. The drawings referenced in the explanations given below are those that schematically show the embodiments, and thus the relative sizes, spacing, positional relationship, and the like of the members might be exaggerated, or the members might be partially omitted. In the explanations below, moreover, the same designations and reference numerals denote the same members or those of similar quality as a general rule, for which detailed explanations will be omitted when appropriate. Furthermore, FIG. 5A to FIG. 5H, FIG. 6A to FIG. 6C, and FIG. 8 only show a part of a whole structure. In each drawing, the primary emission direction Br of the light released from the light emitting device 10 is indicated with an arrow. In the explanations below, the emission direction Br of the light released from the light emitting device 10 is explained as upward and the reverse direction as downwards.

First Embodiment

Light Emitting Device

As shown in FIG. 1 and FIG. 3A to FIG. 3C, the light emitting device 10 includes a rectangular substrate 22, a light emitting element 16 mounted on the substrate 22, a light guide member 24 covering the light emitting element 16, a light transmissive member 25 disposed on the light guide member 24, a reflective member 17 disposed in the periphery of the light transmissive member 25 and the light guide member 24 so as to surround the light emitting element 16, electrodes of the light emitting element 15, and wiring members 14. The light emitting device 10 emits light via the light transmissive member 25 which is the emission face 12. In the example shown in the drawings, the light transmissive member 25 includes a phosphor layer 26 and a light transmissive layer 28 stacked thereon. In the present disclosure, the phosphor layer 26 is not necessarily required. In the explanations below, the light transmissive member which includes a phosphor layer 26 will be explained as an example. Moreover, the reflective member 17 includes first reflective members 18 disposed opposite the lateral faces of the light emitting element 16, and a second reflective member 20 which is positioned on the outside of the first reflective members 18 and disposed to surround the light emitting element 16.

Each constituent element will be successively explained below.

Figure 3A:
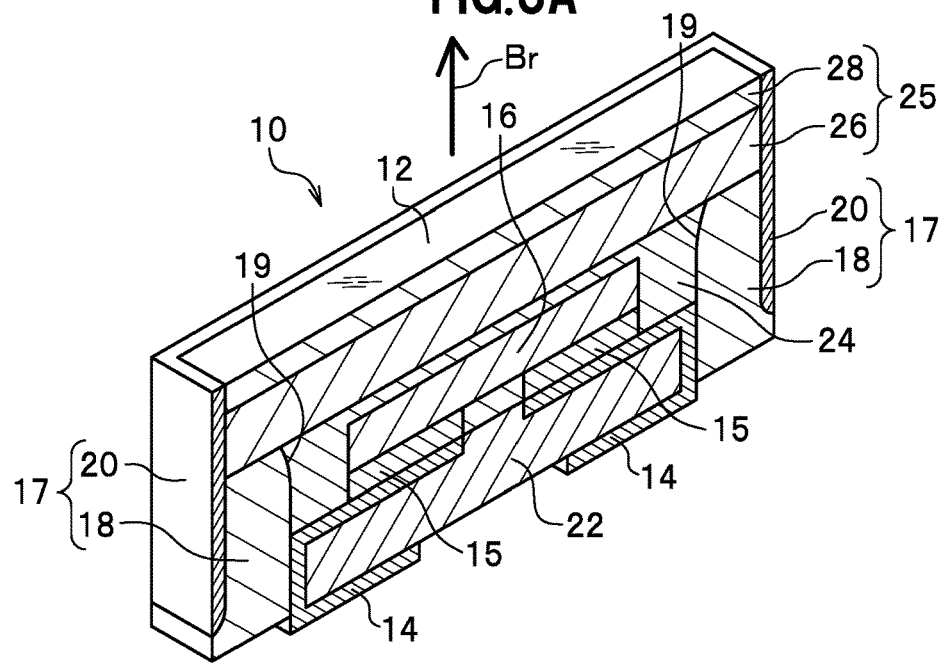
FIG. 3A is a perspective sectional view of a light emitting device according to the first embodiment, the section being in parallel to the long sides and perpendicular to the emission face.
Figure 3B:
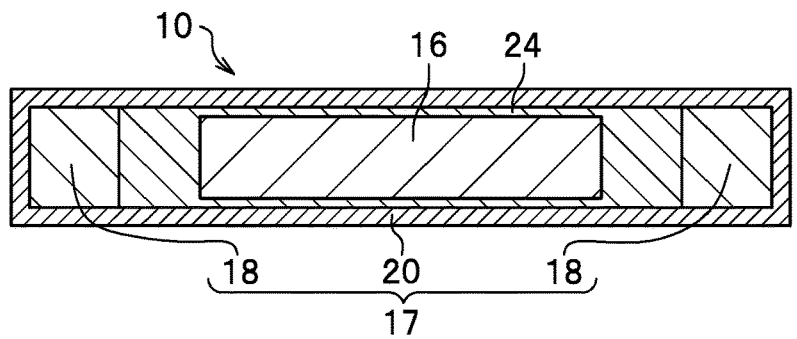
FIG. 3B is a sectional view of a light emitting device according to the first embodiment, the section being in parallel to the long sides and the emission face.
Figure 3C:
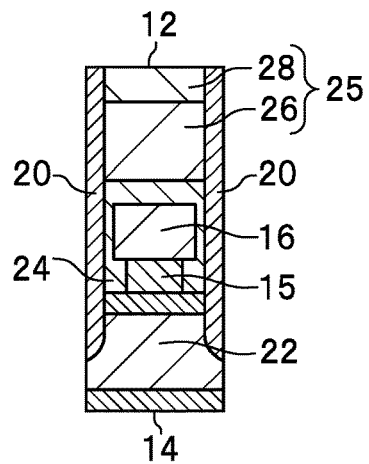
FIG. 3C is a sectional view of a light emitting device according to the first embodiment, the section being in parallel to the short sides and perpendicular to the emission face.

As shown in FIG. 3A to FIG. 3C, the light emitting element 16 includes a light transmissive substrate, semiconductor layers, and electrodes 15. The light emitting element 16 preferably has a rectangular shape when viewed from top, particularly preferable to have a rectangular shape having long sides and short sides. The light emitting element 16 may have another shape and, for example, a hexagonal shape can increase the emission efficiency. The light emitting element 16 preferably has positive and negative (p and n) electrodes on the same face. Moreover, the number of the light emitting elements 16 mounted in a light emitting device 10 may be one or more. In the case of including a plurality of light emitting elements 16, they can be connected in series or parallel.

A light transmissive substrate may simply be one usually used in manufacturing a semiconductor light emitting element; specifically, a sapphire substrate is used. The semiconductor layers are a stack of semiconductor layers which include at least an n-type semiconductor layer and a p-type semiconductor layer, and an active layer interposed therebetween. A material of the semiconductor layers preferably employs a nitride semiconductor capable of emitting short wavelength light that can efficiently excite wavelength conversion substances. Nitride semiconductors are primarily represented by the general formula, $In_xAl_yGa_{1-x-y}N$ ($0 \le x$, $0 \le y$, $x+y \le 1$). Furthermore, the electrodes 15 are formed on one face. The electrodes 15 need to be mountable metal materials, but the type of metal is not particularly limited as long as they are conductive members capable of achieving an electrical connection. The electrodes 15 are bonded to the substrate 22 (described later) via a bonding member.

The bonding member can simply be interposed between the electrodes 15 of the light emitting element 16 and the wiring members 14 of the substrate 22. For example, the bonding member can be disposed in the regions of the wiring members 14 on the substrate 22 where the light emitting element 16 is to be mounted, or on the electrodes 15 of the light emitting element 16, or both. The bonding member can be in the form of a conductive liquid or paste. The application method of the bonding member can be suitably selected from among potting, printing, transfer process, or the like, depending on the viscosity or the like.

The substrate 22 is constructed with at least wiring members 14 and a base that supports the wiring members 14.

The wiring members 14 are formed at least on the upper face (i.e., front face) of the base, and may also be formed inside of and/or on the lateral faces and/or on the lower face (i.e., back face) of the base. The wiring members 14 can be formed, for example, with copper or a copper alloy. In the case of employing a rigid substrate for the base, a resin, fiber reinforced resin, ceramic, glass, metal, paper, or the like can be used. It is particularly preferable to employ a material of the base that has a coefficient of linear expansion closer to that of the light emitting element.

The light guide member 24 is disposed to fill the space between the light emitting element 16 and the reflective member 17 and encapsulates the light emitting element 16 mounted on the substrate 22. For the light guide member 24, a material having good light transmission properties relative to the wavelength of the light emitted by the light emitting element 16 as well as having good weather resistance, light resistance, and heat resistance may be used to serve as an encapsulant. By disposing the light guide member 24 on the lateral faces of the light emitting element 16, the light released from the lateral faces of the light emitting element 16 can be more efficiently guided to the light transmissive member 25. This can alleviate the loss of light, thereby increasing the light extraction efficiency of the light emitting device 10.

Examples of the materials employed for the light guide member 24 include thermoplastic resins and thermosetting resins. For thermoplastic resins, for example, polyphthalamide, liquid crystal polymers, polybutylene terephthalate (PBT), unsaturated polyester, or the like can be used. For thermosetting resins, for example, epoxy resins, modified epoxy resins, silicone resins, modified silicone resins, or the like can be used.

The reflective member 17 constructs the lateral walls of the light emitting device, and reflects the light from the light emitting element 16 to be extracted from the emission face 12. The reflective member 17 includes first reflective members 18 and a second reflective member 20. The reflective member 17 can increase the light extraction efficiency by utilizing the first reflective members 18 and the second reflective member 20.

The reflective member 17 preferably has a reflectance of 70% or higher, more preferably 80% or higher, even more preferably 90% or higher, for the peak emission wavelength of the light emitting element, from the standpoint of light extraction efficiency in the forward direction. Furthermore, the reflective member 17 is preferably white. Accordingly, the reflective member 17 is preferably constructed with a base material containing a white pigment.

A resin can be used as the base material of the reflective member 17, for example, a silicone resin, epoxy resin, phenol resin, polycarbonate resin, acrylic resin, or modified resin of these. Among these examples, silicone resins and modified silicone resins are preferable because they are highly heat resistant and highly light resistant. Specific examples of silicone resins include dimethyl silicone resins, phenylmethyl silicone resins, and diphenyl silicone resins. The base material of the reflective member may contain various fillers in the resins mentioned above. Examples of fillers include silicon oxide, aluminum oxide, zirconium oxide, zinc oxide, and the like. One or a combination of two or more of these fillers can be used. Particularly, silicon oxide is preferable due to its small coefficient of thermal expansion. Furthermore, using nanoparticles for the filler can increase scattering, including Rayleigh scattering, of blue light emitted by the light emitting element, and thus can also reduce the amount of the wavelength conversion substance used. Nanoparticles are particles whose diameters are in a range of from 1 nm to 100 nm. The "particle diameter" herein is defined, for example, by $D_{50}$.

For the white pigment, one or a combination of two or more of titanium oxide, zinc oxide, magnesium oxide, magnesium carbonate, magnesium hydroxide, calcium carbonate, calcium hydroxide, calcium silicate, magnesium silicate, barium titanate, barium sulfide, aluminum hydroxide, aluminum oxide, and zirconium oxide can be used. Particle shapes of the white pigment are not particularly limited, and may be a irregular or non-uniform shape or a crushed shape. A spherical shape is preferable from the fluidity standpoint. The particle diameter of the white pigment, for example, is from about 0.1 µm to about 0.5 µm. In order to enhance the light reflection properties and the effectiveness of coverage, the smaller the particle diameter, the more preferable it is. The white pigment content of the reflective member can be suitably selected, and from the standpoint of light reflection properties or viscosity in a liquid state, for example, it is preferably in a range of from 10 wt % to 80 wt %, more preferably from 20 wt % to 70 wt %, even more preferably from 30 wt % to 60 wt %. The term "wt %," which is weight percent, represents the weight ratio of the applicable material to the total weight of the first reflective members 18 or the second reflective member 20.

In the case of employing a light emitting element 16 having long sides and short sides in a top view, the first reflective members 18 are disposed opposite the short sides of the light emitting element 16. The first reflective members 18 have opposing oblique or curved portions in the inner lateral faces 19 that are slanted so that the distance therebetween becomes wider towards the light transmissive member 25 from the substrate 22 side. In other words, each of the pair of first light transmissive members 18 has an oblique or curved portion in the inner face 19 that is slanted so that the distance between the two opposing inner faces gradually increases towards the emission direction Br from the substrate 22 side. The outer lateral faces of the first reflective members 18 are disposed in the state of being in contact with the inner lateral faces of the second reflective member 20. The upper ends of the first reflective members 18 are disposed in the state of being in contact with the lower face of the phosphor layer 26. Furthermore, the first reflective members 18 are in contact with the lateral faces of the substrate 22 corresponding to the short sides, and the lower faces of the first reflective members 18 are flush with the lower face of the substrate 22. In the region where the second reflective member 20 is disposed, part of the first reflective members 18 exist under the lower end of the second reflective member 20 so that the lower end of the second reflective member 20 is positioned higher than the lower ends of the first reflective members 18. For the first reflective members 18, the same light reflecting material as that of the second reflective member 20 described below is used as an example.

The second reflective member 20 is disposed to surround the first reflective members 18 and the light emitting element 16. The second reflective member 20 forms the lateral walls of the light emitting device 10. The second reflective member 20 is disposed such that its upper end is flush with the upper face of the light transmissive member 25 while covering the lateral faces of the light transmissive member 25. Furthermore, as shown in FIG. 3C, the second reflective member 20 is disposed so as to be in contact with the upper face edges of the substrate 22 along the long sides. A thickness of the second reflective member 20 is not specifically limited, but in FIG. 3A and the like, the thickness of the second reflective member 20 is set to one half of or smaller than that of a first reflective member 18. The second reflective member 20 is preferably as thick as or thinner than the thickness of a first reflective member 18. Forming the second reflective member 20 thinly allows the emission face 12 to secure a larger area, thereby propagating the extracted light over a wide expanse of space.

The second reflective member 20 is produced by filling the grooves created in the first reflective members 18 formed in accordance with the step in the manufacturing method discussed later. The material of the second reflective member 20 whose thickness is set to be smaller than that of the first reflective members 18 may be of the same material as or different from that of the first reflective members 18. Here, both members are being explained as employing the same material as one example, and the reflective member discussed earlier, for example, is preferably used.

By way of this construction, the first reflective members 18 and the second reflective member 20 are less likely to absorb the light released from the light emitting element 16 and the phosphor. Moreover, the first reflective members 18 and the second reflective member 20 play a role of reflecting the light from the light emitting element 16 and the phosphor to guide the light to the emission face 12. Setting a small thickness for the second reflective member 20 allows the emission face 12 at the upper face of the light emitting device 10 to secure as large an area as possible, thereby improving the light extraction efficiency.

The phosphor layer 26 is disposed on the first reflective members 18 and the light guide member 24. The phosphor layer 26 converts the wavelength of the light from the light emitting element 16. For example, the light emitting element 16 emits blue light, and the wavelength conversion substance, which is a phosphor, in the phosphor layer 26 converts a portion of the blue light into, for example, yellow light. This allows the light emitting device 10 to emit the light resulting from mixing the colors, e.g., white light. The phosphor layer 26 may contain several types of wavelength conversion substances, and contain a filler similar to that contained in the reflective member described earlier instead of, or in addition to, a wavelength conversion substance.

The phosphor layer 26 can contain a wavelength conversion substance (e.g., phosphor) known in the art. Examples of wavelength conversion substances include cerium-activated yttrium aluminum garnet (YAG)-based phosphors that emit green to yellow light, cerium-activated lutetium aluminum garnet (LAG)-based phosphors that emit green light, europium and/or chromium-activated nitride-containing calcium aluminosilicate ($CaO$—$Al_2O_3$—$SiO_2$)-based phosphors that emit green to red light, europium-activated silicate (($Sr,Ba)_2SiO_4$)-based phosphors that emit blue to red light, ß-SiAlON phosphors that emit green light, nitride-based phosphors, such as CASN-based phosphors expressed as $CaAlSiN_3$:Eu or SCASN-based phosphors expressed as $(Sr,Ca)AlSiN_3$:Eu, that emit red light, $K_2SiF_6$:Mn (KSF)-based phosphors that emit red light, sulfide-based phosphors that emit red light, and the like.

The light transmissive layer 28 transmits the light from the phosphor layer 26, the light from the light emitting element 16, and the light from the reflective member 17 therethrough to be extracted. The upper face of the light transmissive layer 28 serves as the emission face 12. The light transmissive layer 28 is in contact with the phosphor layer 26 and its lateral faces in contact with the second reflective member 20. The upper face of the light transmissive layer 28 and the upper face of the second reflective member 20 are formed to be flush with each other. The light transmissive layer 28 is preferably formed using a material which has light transmitting properties, as well as having good weather resistance, light resistance, and heat resistance to serve as an encapsulant.

The "light transmitting properties" here refers to a transmittance of preferably 60% or higher, more preferably 70% or higher, even more preferably 80% or higher for the peak emission wavelength of the light emitting element. Examples of the base material used for the light transmissive layer 28 include silicone resins, epoxy resins, phenol resins, polycarbonate resins, acrylic resins, or their modified resins. The base material of the light transmissive layer 28 may be glass. Among such examples, silicone resins and modified silicone resins are preferable for the base material of the light transmissive layer 28 due to its highly heat resistant and light resistant. Specific examples of silicone resins include dimethyl silicone resins, phenylmethyl silicone resins, and diphenyl silicone resins. The light transmissive member 25 can be constructed with one of these base materials, or by stacking two or more of these base materials. The base material of the light transmissive layer 28, which is the foregoing resins or glass, may contain a filler similar to that contained in the base materials of the first reflective members 18 and the second reflective member 20 described earlier.

The light emitting device 10 is constructed as above, and once light is emitted from the light emitting element 16, the light transmits through the light guide member 24 and then through the light transmissive member 25 (i.e., the phosphor layer 26 and the light transmissive layer 28), and is extracted from the emission face 12. The oblique or curved portions in the inner faces 19 of the first reflective members 18 allow a portion of the light from the light emitting element 16 to be more readily extracted from the emission face 12. The second reflective member 20 which covers the lateral faces of the phosphor layer 26 and the light transmissive layer 28 reflects light to be extracted from the emission face 12.

The first reflective members 18 each have a required thickness (e.g., equal to or thicker than the substrate 22) and form a supporter for the light emitting device 10 together with the substrate 22, thereby maintaining the strength of the light emitting device as a whole. Furthermore, disposing the phosphor layer 26 and the light transmissive layer 28 above the upper ends of the first light reflective members 18 can secure a wider area for the emission face 12 at the upper face of the light emitting device 10. Forming the oblique or curved portions in the inner lateral faces 19 at the upper parts of the first reflective members 18 facilitates the extraction of the light from the light emitting element 16 through the emission face 12. Accordingly, the light emitting device 10 has an improved light extraction efficiency and attenuated color non-uniformity.

Method of Manufacturing Light Emitting Device

Subsequently, a method of manufacturing the light emitting device related to the first embodiment will be explained below.

Figure 4:
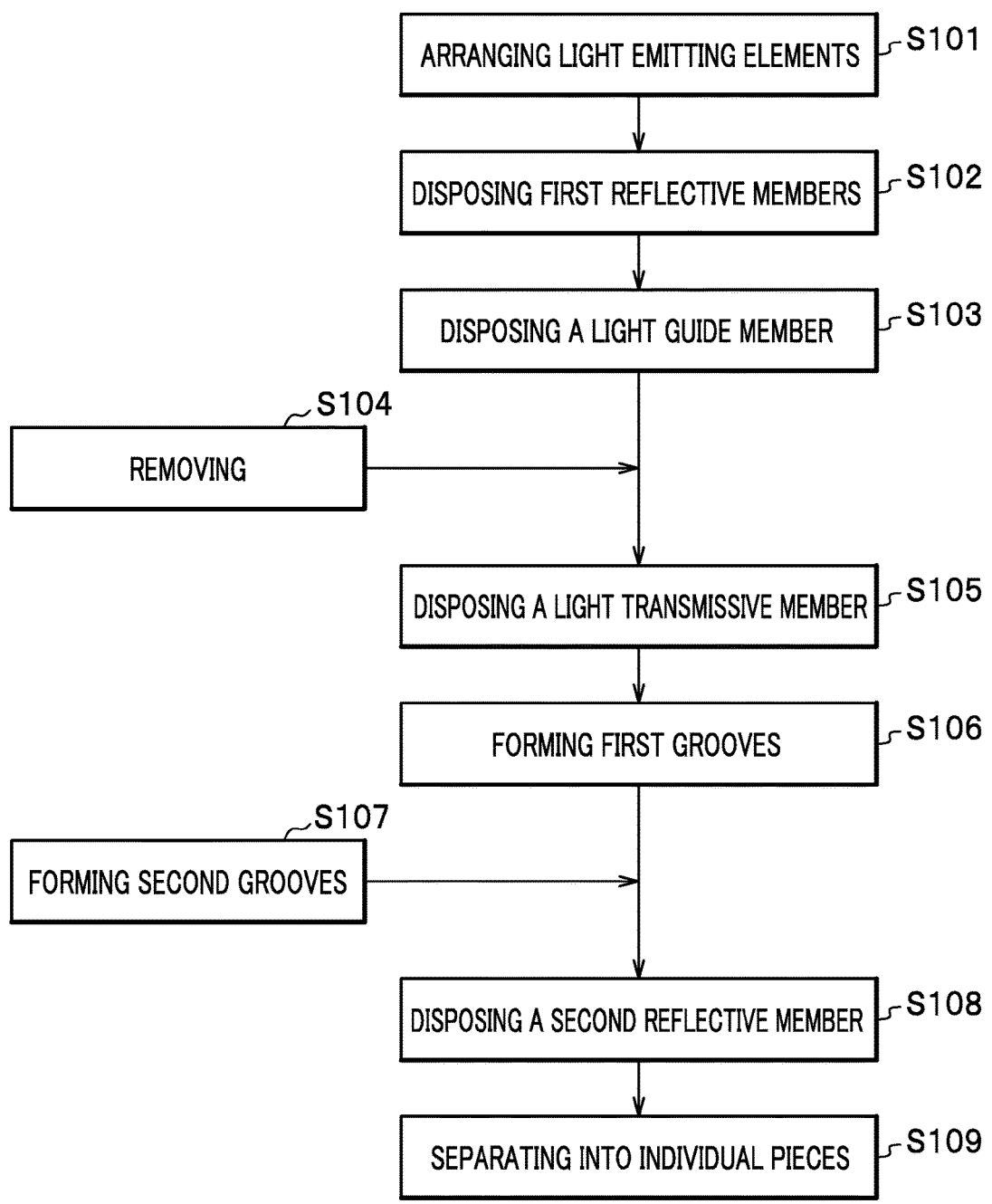
FIG. 4 is a flowchart showing one example of a method of manufacturing the light emitting device related to the first embodiment of the present disclosure.

As shown in FIG. 4, the method of manufacturing the light emitting device includes: arranging light emitting elements 16 (S101); disposing first reflective members 18 (S102); disposing a light guide member 24 (S103); disposing a light transmissive member 25 (S105); forming first grooves 32 (S106); disposing a second reflective member 20 (S108); and separating into individual pieces (S109). The method of manufacturing the light emitting device may include a removal step (S104) following the step of disposing a light guide member 24 (S103), and may further include a step of forming second grooves 34 (S107) following the step of forming the first grooves 32 (S106). Each step will be explained below.

Figure 5A:
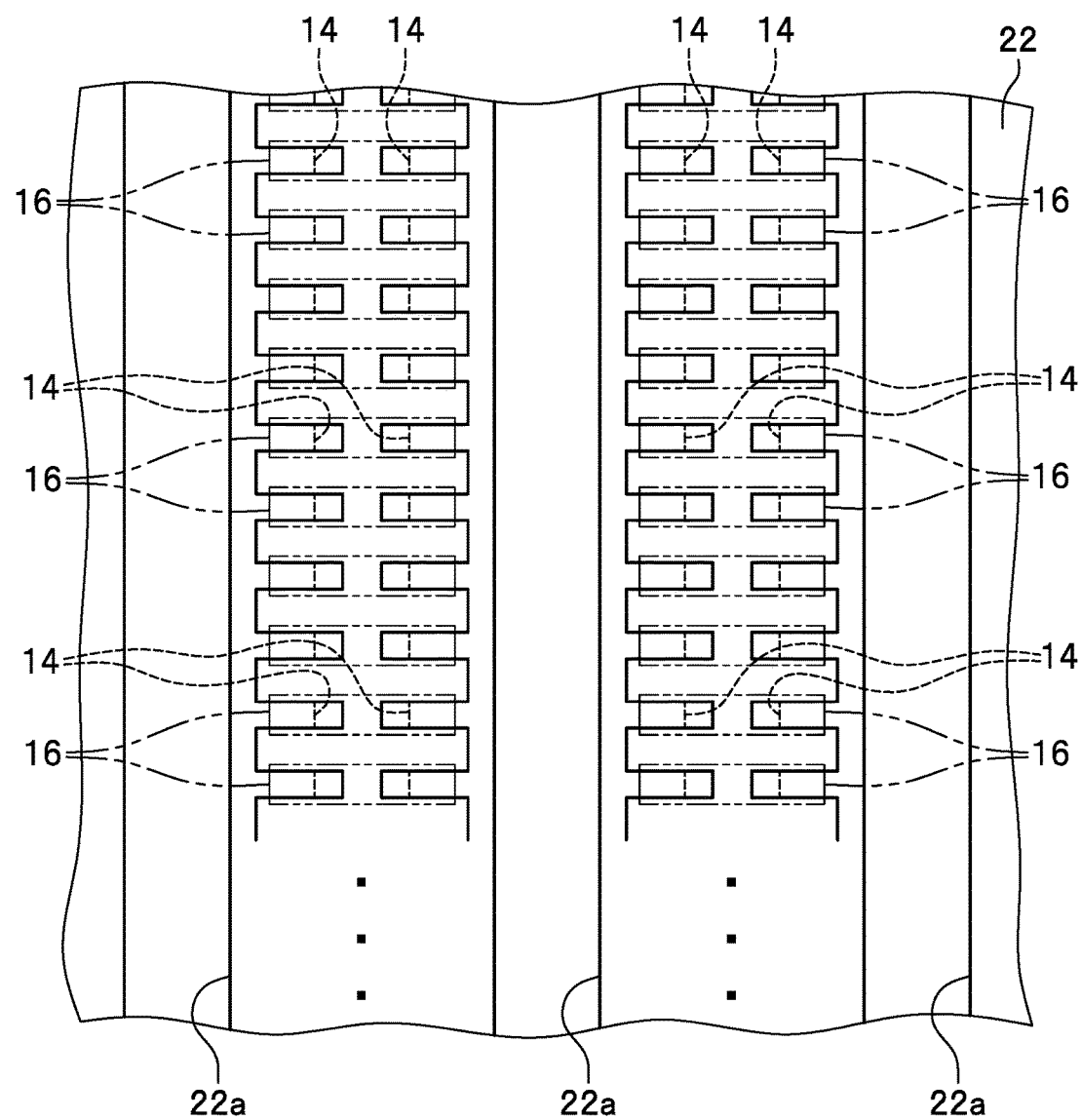
FIG. 5A is a plan view of a substrate in which some components are omitted for ease of explanation of the step of arranging light emitting elements shown in the flowchart in FIG. 4.

First, as shown in FIG. 4 and FIG. 5A, in the step of arranging light emitting elements 16 S101, a plurality of light emitting elements 16 are arranged on the substrate 22 on which wiring members 14 have already been formed. It is preferable to arrange the light emitting elements 16 via bonding members by flip chip mounting. The light emitting elements 16 are arranged in rows and columns at predetermined intervals. The light emitting elements 16 are arranged using larger intervals for the arrangement in columns than the intervals for the arrangement in rows. Furthermore, the substrate 22 has through holes 22*a* along the columns. The through holes 22*a* are formed along the rows, more specifically, formed continuously along the positions opposite the short sides of the light emitting elements 16, but not formed along the peripheral edges of the substrate 22. The operations are performed in the state where an adhesive sheet 30 is attached to the back face of the substrate 22.

Figure 5B:
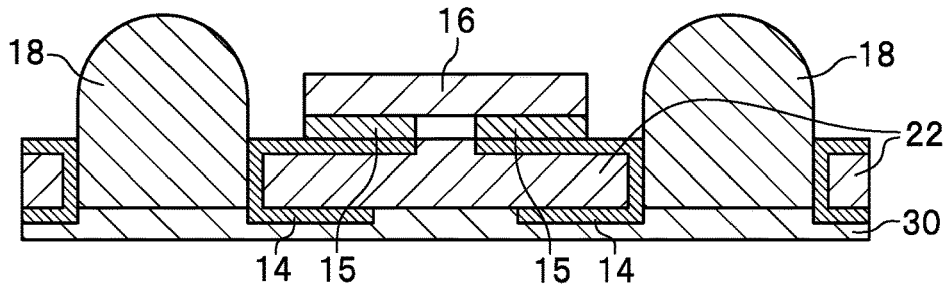
FIG. 5B is a sectional view for explaining the step of disposing first reflective members shown in the flowchart in FIG. 4.

In the step of disposing first reflective members 18 (S102), in the light emitting elements 16 arranged in rows and columns on the substrate 22, first reflective members 18 are disposed between the light emitting elements 16 along the columns. In other words, the first reflective members 18 are disposed in the through holes 22*a* formed along the columns in FIG. 5A. In detail, as shown in FIG. 5B, the first reflective members 18 are disposed close to the both ends of the light emitting elements 16 to oppose the short sides thereof that are mounted on the substrate 22.

The first reflective members 18 provided with a preadjusted viscosity are disposed away from the light emitting elements 16 so as to maintain the heights equal to or higher than the upper face of the substrate 22 while penetrating the through holes 22*a*. The through holes 22*a* are created in the substrate 22 beforehand along the regions where the first reflective members 18 are to be disposed, and an adhesive sheet 30 is applied to the lower face side of the substrate 22 so as to close the openings of the through holes 22*a*. Thus, the lower faces of the first reflective members 18 are formed to be flush with the lower face of the substrate 22. Furthermore, at the upper portions of the first reflective members 18, oblique or curved portions are formed due to surface tension and viscosity. The first reflective members 18 are disposed to be higher than the upper ends of the light emitting elements 16. Alternatively, a guide may be placed on the substrate when disposing the first reflective members 18 to achieve predetermined shapes and heights, thereafter the guide may be removed once the first reflective members 18 are cured. The first reflective members 18 can be formed by transfer molding, injection molding, compression molding, potting, or the like.

Figure 5C:
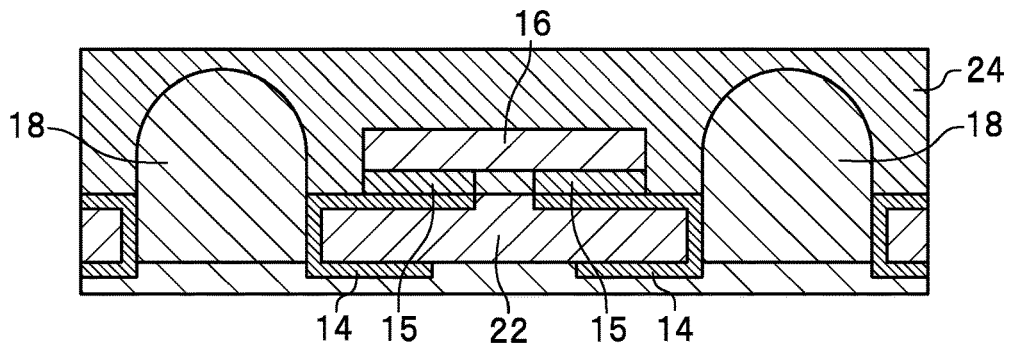
FIG. 5C is a sectional view for explaining the step of disposing a light guide member shown in the flowchart in FIG. 4

Subsequently, as shown in FIG. 4 and FIG. 5C, in the step of disposing a light guide member (S103), the spaces between the first reflective members 18 and the light emitting elements 16, and the spaces between the light emitting elements 16, are filled with the light guide member 24. Here, the light guide member 24 fills the spaces and to a height so as to bury the first reflective members 18 and the light emitting elements 16, followed by being cured. To cure the light guide member 24, it is preferably heated in the case of a thermosetting resin, or subjected to ultraviolet light irradiation in the case of a UV curable resin, by intention. Examples of filling methods include transfer molding, injection molding, potting, and the like.

Figure 5D:
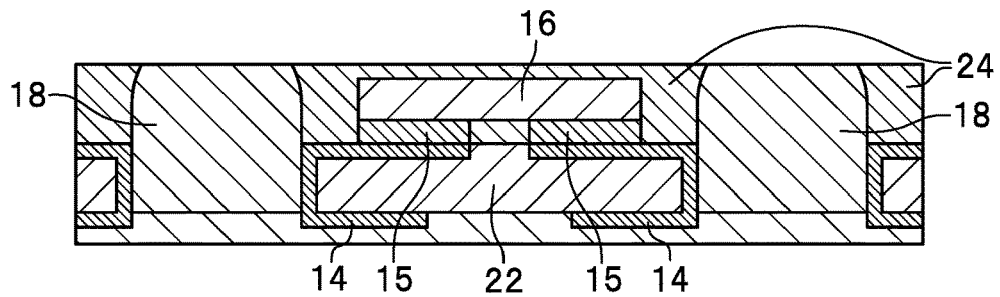
FIG. 5D is a sectional view for explaining the removal step shown in the flowchart in FIG. 4.

As shown in FIG. 4 and FIG. 5D, in the removal step S104, the light guide member 24 and the first reflective members 18 are partially removed to be flat and to maintain a height to allow the light guide member 24 to present on the light emitting elements 16. The light guide member 24 and the first reflective members 18 may be removed by using a grindstone, disk-shaped rotary blade, plane, or the like.

Figure 5E:
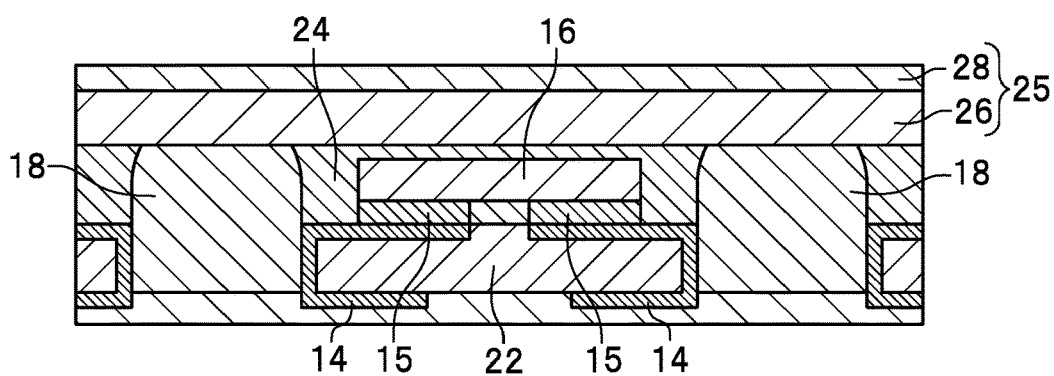
FIG. 5E is a sectional view for explaining the step of disposing light transmissive members shown in the flowchart in FIG. 4.

Subsequently, as shown in FIG. 4 and FIG. 5E, in the step of disposing a light transmissive member S105, the light transmissive member 25 including the phosphor layer 26 and the light transmissive layer 28 is disposed on the upper surfaces of the light guide members 24 and the first reflective members 18 via light transmissive joining material. The phosphor layer 25 is formed using a sheet member containing at least one phosphor in advance. The light transmissive layer 28 is formed using a sheet member. The sheet member serving as the phosphor layer 26 contains at least one phosphor in advance. The sheet layer serves as the light transmissive layer 28. In FIG. 5E, the sheet member of the phosphor layer 26 is formed thicker than the sheet member of the light transmissive layer 28, however, the thicknesses may be appropriately selected. The phosphor layer 26 and the light transmissive layer 28 may have the same thickness, or the light transmissive layer 28 may be formed thicker than the phosphor layer 26. Furthermore, a sheet shaped light transmissive member 25 is used in the above description, but is not limited thereto. The light transmissive member 25 may be formed by spraying a liquid material, printing, or the like.

Figure 5F:
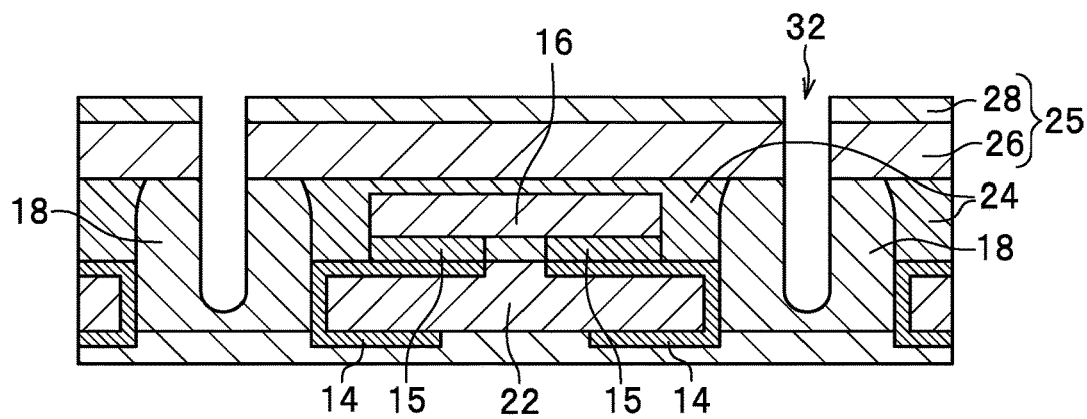
FIG. 5F is a sectional view for explaining the step of forming first grooves and the step of forming second grooves shown in the flowchart in FIG. 4.
Figure 6A:
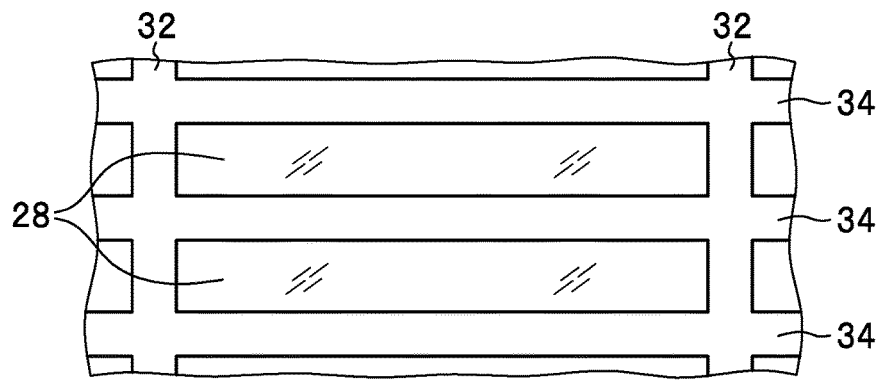
FIG. 6A is a plan view for explaining the step of forming first grooves and the step of forming second grooves shown in the flowchart in FIG. 4.

Subsequently, as shown in FIG. 4, FIG. 5F, and FIG. 6A, in the step of forming first grooves 32 (S106), the light transmissive members 25 (the phosphor layer 26 and the light transmissive layer 28 stacked thereon) and the first reflective members 18 are partially removed by dicing using a disk-shaped rotary blade or the like so as to go through the center of each first reflective member 18, thereby forming first grooves 32 having a prescribed groove width. Here, preferably, the depth of the first grooves 32 is defined such that the tips of the first grooves 32 are located in the first reflective members 18 after penetrating through the light transmissive member 25. In the step of disposing a second reflective member 20 in the first grooves 32 (S108) as the subsequent step, all of the lateral faces of the light transmissive member 25 can be covered with the second reflective member 20. This can alleviate light leakage from the lateral faces of the light transmissive member 25 when the devices are separated in the step of separating into individual pieces (S109).

The first grooves 32 are formed by using a machining apparatus which employs a blade that rotates while moving along the center of the first reflective members 18. In forming the first grooves 32, the machining operation may be performed by moving the table on which the substrate 22 is placed in the X direction and the Y direction (perpendicular to the X direction) while securing the machining apparatus in position, or by moving the machining apparatus while securing the table in position. Moreover, here, the step of forming second grooves (S107) is performed along rows which are perpendicular to the first grooves 32. The second grooves 34 are formed between rows of a plurality of light emitting elements 16 that are two-dimensionally arranged. The second grooves 34 are preferably formed to reach the substrate 22 penetrating through the light transmissive member 25 and the light guide member 24. In this manner, in the step of disposing a second reflective member (S108) as the subsequent step, the lateral faces of light guide members 24 located between the rows can be entirely covered with the second reflective member 20, thereby alleviating escape of the light from the light guide members 24.

Figure 5G:
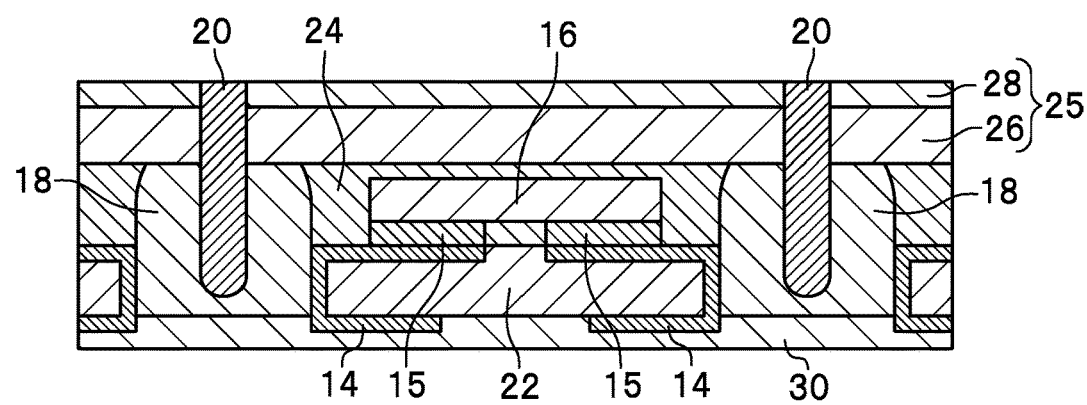
FIG. 5G is a sectional view for explaining the step of disposing a second reflective member shown in the flowchart in FIG. 4.
Figure 6B:
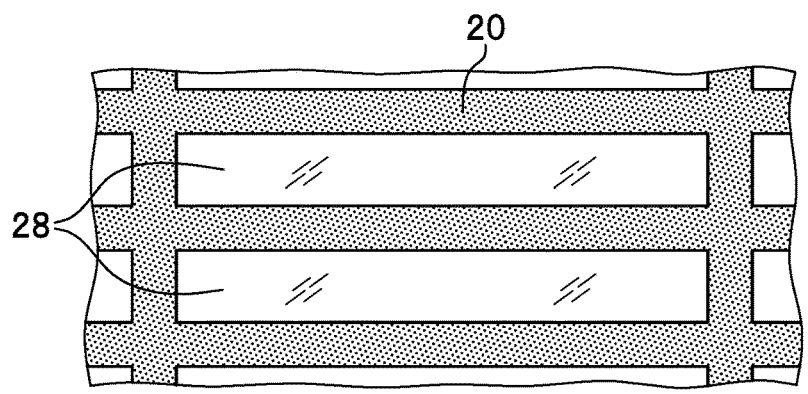
FIG. 6B is a plan view for explaining the step of disposing a second reflective member shown in the flowchart in FIG. 4.

Then, as shown in FIG. 4, FIG. 5G, and FIG. 6B, in the step of disposing a second reflective member S108, the first grooves 32 and the second grooves 34 are filled with the second reflective member 20 by transfer molding, injection molding, compression molding, potting, or the like. The second reflective member 20 is formed with the same material as that of the first reflective members 18 as an example. Here, a removal process is performed after curing the second reflective member 20 to adjust the thicknesses of the sheet member of the light transmissive layer 28 and the second reflective member 20. Here, the removal process is performed so that the light transmissive layer 28 becomes flat and has a predetermined thickness.

Figure 5H:
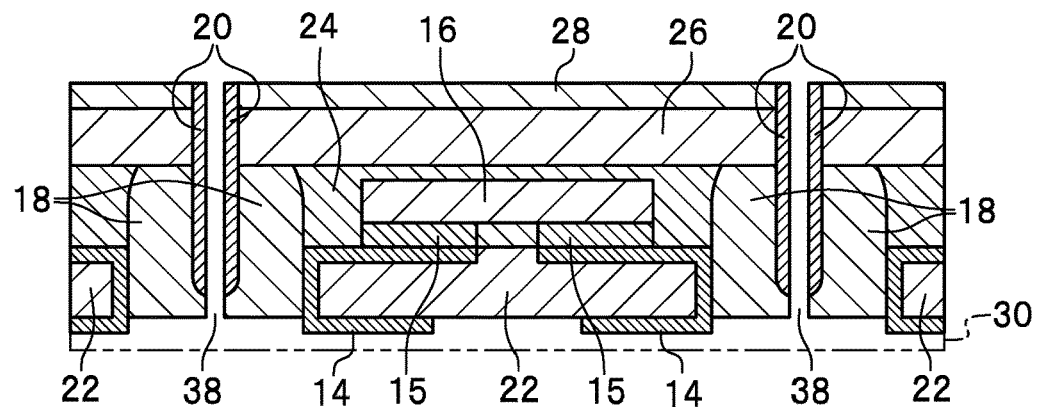
FIG. 5H is a sectional view explaining the step of separating into individual pieces shown in the flowchart in FIG. 4.
Figure 6C:
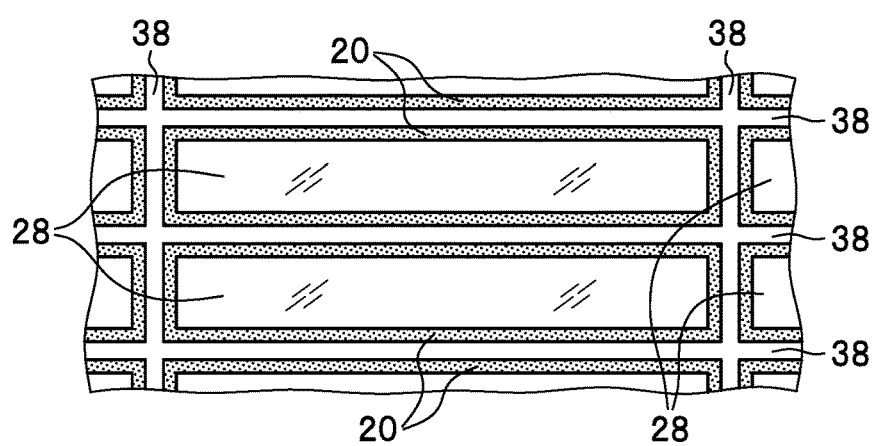
FIG. 6C is a plan view for explaining the step of separating into individual pieces shown in the flowchart in FIG. 4.

As shown in FIG. 4, FIG. 5H, and FIG. 6C, in the step of separating into individual pieces (S109), cuts 38 reaching the adhesive tape 30 are made in the center of the second reflective member 20 along rows and columns by dicing, using a machining apparatus having a disk-shaped rotary blade, an ultrasonic cutter having a cutting blade, or a push type cutter. In the step of separating into individual pieces (S109), the machining operation is performed by using a blade having a smaller thickness than one used in forming the first grooves 32 and the second grooves 34. The individual light emitting devices 10 remain adhered to the adhesive sheet 30 after cutting into pieces. Thereafter, removal of the adhesive sheet 30 produces individual free-standing light emitting devices 10.

In the light emitting device 10, the first reflective members 18 are constructed so that their lower faces are flush with the lower face of the substrate 22. Accordingly, the light emitting devices 10 having such a construction are separated into individual pieces by dicing the reflective member 17 by using a disk-shaped rotary blade, cutting blade of an ultrasonic cutter, a push-type cutter, or the like, without requirement of cutting the substrate 22. This can simplify the separation process.

Second Embodiment

Subsequently, a second embodiment of the light emitting device will be explained primarily with reference to FIG. 7 and FIG. 8. The same reference numerals denote the same parts as those in the first embodiment for which the explanations are omitted when appropriate.

Figure 7:
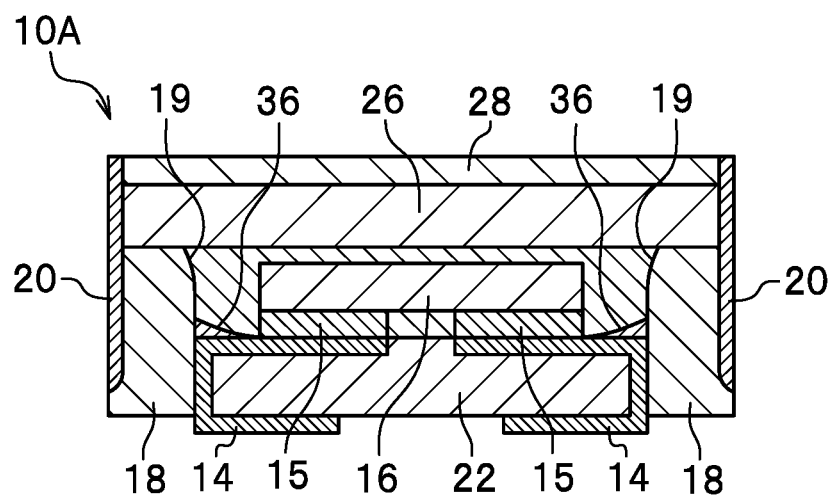
FIG. 7 is a schematic sectional view of a light emitting device according to a second embodiment.

As shown in FIG. 7, the light emitting device 10A includes third reflective members 36 disposed on the substrate 22 to oppose the long sides and/or short sides of the light emitting element 16 in the regions between the first reflective members 18 and the light emitting element 16. The third reflective members 36 have opposing oblique or curved inner faces which are in contact with the inner lateral faces of the first reflective members 18, and slanted so that its thickness in a direction from the substrate side towards the light transmissive member side increase in a direction from the light emitting element side toward the first reflective member side. In other words, each of the third reflective members 36 has an oblique or curved inner lateral face which is in contact with an inner lateral face of a first reflective member 18, and slanted so that the distance from the lateral surfaces of the light emitting element 16 to the opposing inner faces of the third reflective member 36 gradually increases towards the irradiation direction Br.

The third reflective members 36 are disposed so as to be lower than the height of the light emitting element 16. The third reflective members 36 are disposed away from the light emitting element 16. The third reflective members 36 may be formed with a material that is the same as or different from the material of the first reflective members 18 and the second reflective member 20. Disposing the third reflective members 36 is less likely to cause light absorption by the upper face of the substrate 22 while properly guiding light to the emission face 12, thereby further improving the light extraction efficiency.

The light emitting device 10A is manufactured by performing the step of disposing the third reflective members before performing the step of disposing light guide members (S103) after performing the step of disposing the first reflective members (S102) among the steps shown in FIG. 4.

Figure 8:
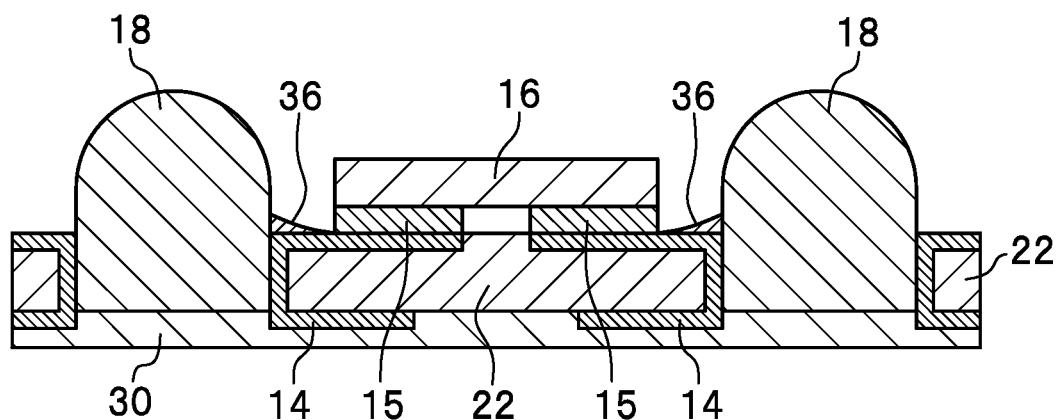
FIG. 8 is a sectional view for explaining a manufacturing process for a light emitting device according to the second embodiment.

That is, as shown in FIG. 8, in the step of disposing the third reflective members, the third reflective members 36 are disposed on the inner side of the first reflective members 18 along the directions of columns. The third reflective members 36 whose viscosity is adjusted in advance are formed to have oblique or curved faces with respect to the emission face 12. After performing the step of disposing the third reflective members 36, the step of disposing the light guide member (S103) is performed, followed by the remaining steps as shown in FIG. 4.

Subsequently, third to sixth embodiments will be explained with reference to FIG. 9 to FIG. 12. The same parts as those that have already been explained will be denoted by the same reference numerals for which the explanations will be omitted when appropriate.

Third Embodiment

Figure 9:
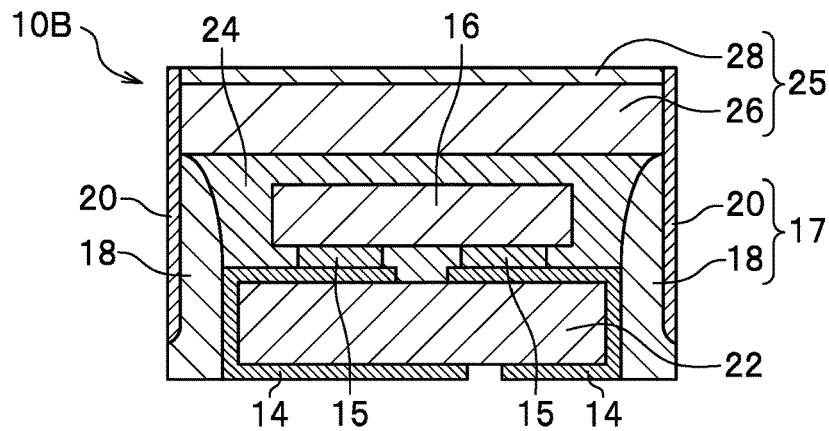
FIG. 9 is a schematic sectional view of a light emitting device according to a third embodiment.

As shown in FIG. 9, in the light emitting device 10B, the lower faces of the first reflective members and the lower face of the substrate 22 are formed to be flush with each other. In detail, the lower ends of the wiring members 14 constructing the lower face of the substrate 22 are formed to be flush with the lower faces of the first reflecting members 18. It is also preferable to form the lower face of the substrate 22 to be flush with the lower faces of the first reflective members 18 in the other embodiments as well. This can realize mounting of the light emitting device in a stable manner, less likely to be tilted, thereby enhancing the mounting accuracy.

The two wiring members 14 on the lower face side of the substrate 22 may have different lengths. Indicating the polarity by giving different lengths to the wiring members 14 can prevent or alleviate errors in connecting the light emitting device 10B to an external device.

Fourth Embodiment

Figure 10:
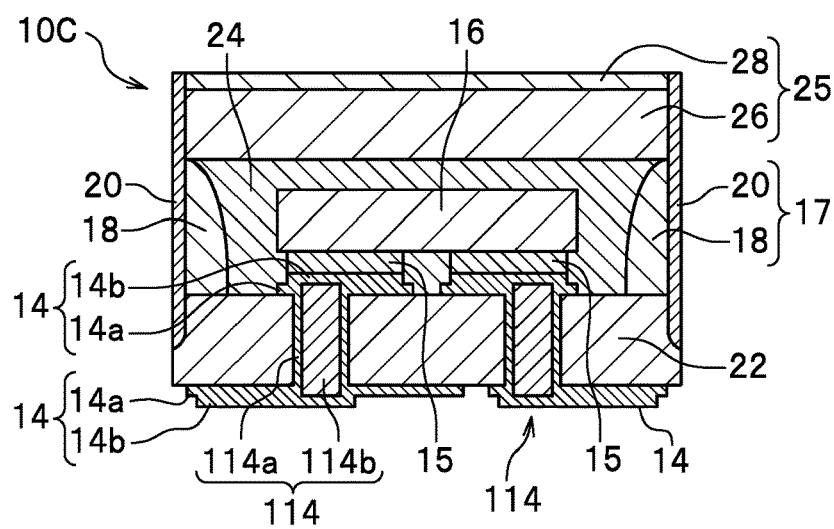
FIG. 10 is a schematic sectional view of a light emitting device according to a fourth embodiment.

As shown in FIG. 10, in the light emitting device 10C, the wiring members 14 may be constructed as one that utilizes vias 114 produced by forming through holes in the substrate 22. Vias 114 each include a cylindrical inner wall wiring member 114a disposed on the inner circumferential surface of a through hole formed in the direction of thickness (i.e., length from the upper surface to the loser surface) of the substrate 22, and a filling member 114b filled in the inner wall wiring member 114a. For the inner wall wiring member 114a of a via 114, a similar material to that used for the wiring members 14 can be used. The inner wall wiring members 114a conduct electricity to the electrodes 15 via the wiring members 14 on the upper face of the substrate 22, and are connected to the wiring members 14 formed on the lower face of the substrate 22. The filling members 114b of vias 114 are formed by filling an insulating material, such as an epoxy resin. The filling members 114b are formed to have a longer length than the thickness of the substrate 22. The wiring members 14 include base wiring members 14a and connection wiring members 14b. The base wiring members 14a are disposed on the upper face and the lower face of the substrate 22 in predetermined areas to surround the upper and lower ends of the filling member 114b for electrical conduction with the inner wall wiring members 114a. The connection wiring members 14b face the base wiring members 14a and cover the filling members 114b to conduct electricity to the electrodes 15. The wiring members 14 are disposed on the upper face side and the lower face side of the substrate independently from one another for the electrodes 15, and electrical conduction between the opposing upper and lower wiring members 14 is accomplished by the inner wall wiring members 114a.

In the light emitting device 10C, the lower faces of the first reflective members 18 are disposed to be in contact with the upper face of the substrate 22. Furthermore, the first reflective members 18 are formed so that their upper faces are positioned higher than the upper face of the light emitting element 16. In the light emitting device 10C, moreover, the second reflective member 20 is formed from around the center of the substrate 22 in the thickness direction to the upper face of the light transmissive member 25.

Fifth Embodiment

Figure 11:
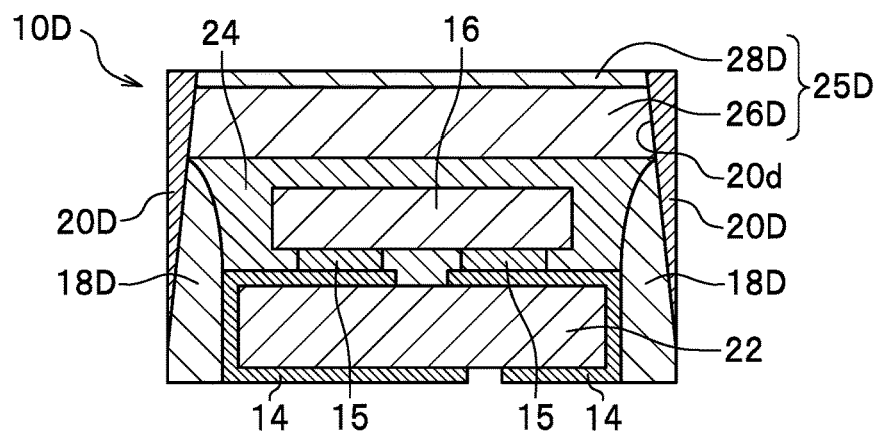
FIG. 11 is a schematic sectional view of a light emitting device according to a fifth embodiment.

As shown in FIG. 11, in the light emitting device 10D, the second reflective member 20D is formed to have opposing oblique faces 20d so that the distance therebetween becomes smaller towards the light transmissive member 25D. The second reflective member 20D is formed, for example, to have a triangular section in the area from the middle of the first reflective members 18D in the direction of height to the upper face of the light transmissive member 25D. The formation of the second reflective member 20D provides the first reflective members 18D with oblique faces at the interfaces with the second reflective member 20D. Furthermore, the formation of the second reflective member 20D provides the phosphor layer 26D and the light transmissive layer 28D with trapezoidal sectional shapes. The second reflective member 20D allows the upper part of the light transmissive member 25D to have a prescribed width. This can more effectively reduce damage of the light transmissive member 25D that can be caused by the light emitting device 10D coming into contact with other parts.

In manufacturing the light emitting device 10D, referring to FIG. 5F, the second reflective member 20D can be formed in such a shape by forming the first grooves 32 to have a V-shaped cross section. The section of the second reflective member 20D may be trapezoidal, triangular, or staircase shaped, as long as the thickness is set large near the light transmissive member 25D and set smaller towards the substrate 22.

Sixth Embodiment

Figure 12:
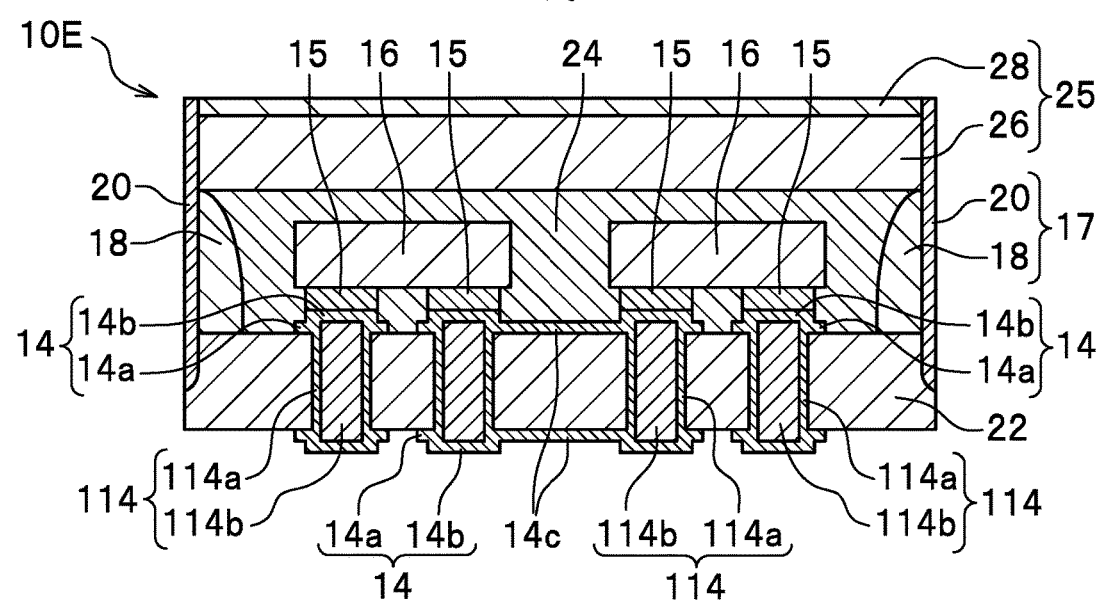
FIG. 12 is a schematic sectional view of a light emitting device according to a sixth embodiment.

As shown in FIG. 12, the light emitting device 10E uses similar to the light emitting device 10C shown by the fourth embodiment, includes a plurality of light emitting elements 16 (e.g. two light emitting elements as shown in FIG. 12). In the light emitting device 10E, in order to enable simultaneous on/off operations of the two light emitting elements 16, conduction wiring members 14c connect the base wiring members 14a of one of the wiring members 14 of each so as to mutually conduct electricity. The light emitting devices related to the other embodiments may also be constructed to include a plurality of light emitting elements as in the case of the light emitting device 10E.

Furthermore, in the first to fifth embodiments explained above, it is preferable to provide the second reflective member 20 or 20D with higher mechanical strength or hardness as compared to the first reflective members 18 or 18D. That is, the second reflective member 20 or 20D can readily come into contact with other component outside the light emitting device, such as a light guide plate. Thus providing higher strength or hardness can attenuate damage such as deformation or chipping even when subjected to an excessive load. Here, in the case of increasing the hardness of a member, even if the same base material is used for the first reflective members and the second reflective member, the hardness can be increased, for example, by varying the amount of the substance, such as titanium oxide or the like, contained in the member. Moreover, even when the same silicone resin is used, one having different hardness can be selected, such as using a higher hardness silicone resin for the second reflective member 20 or 20D. Furthermore, the second reflective member 20 or 20D and the first reflective members 18 or 18D can have different hardness by employing different resins therebetween. For example, a silicone resin is used for the first reflective members 18 or 18D, and an epoxy resin which generally has higher hardness than silicone resins is used for the second reflective member 20 or 20D.

The term "higher strength of a member", means that in the case where the base material is the same silicone resin, for example, the one having higher tensile strength in comparison of the tensile strength. The term "higher strength of a member", means that in the case where the base is the same epoxy resin, for example, the one having higher bending strength in comparison of the bending strength. In the case of using different types of resins, for example, one is a silicone resin and the other is an epoxy resin, the magnitude of the strength can be determined by converting the bending strength or the tensile strength to the other to be compared.

The hardness or strength of a member can be determined by measuring it using a known measuring method, such as JIS or the like. The strength of a member refers to the resistance of the member to deformation or destruction.

Variations

Figure 13A:
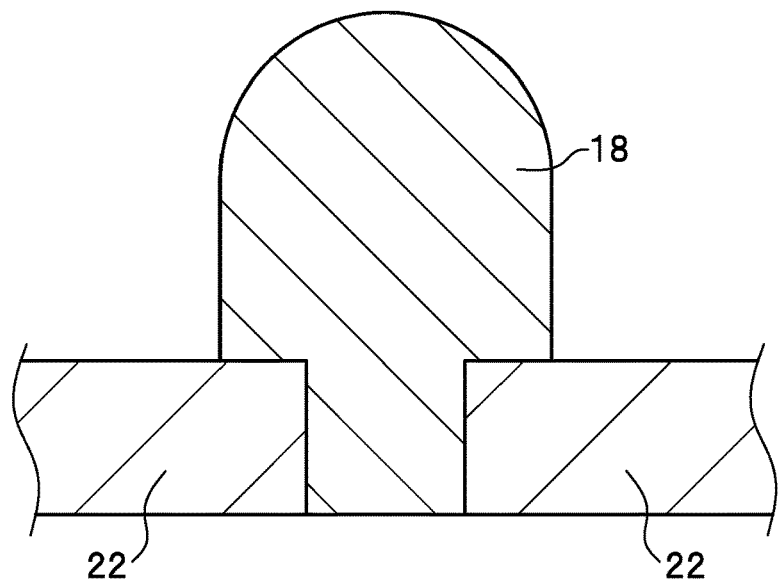
FIG. 13A is a partial sectional view of a first reflective member in a light emitting device which is a variation of the embodiments of the present invention.

In each of the embodiments above, it has been explained that through holes 22a created in the substrate 22, and the lower faces of the first reflective members 18 are flush with the lower face of the substrate 22. However, as shown in FIG. 13A, the lower face of the first reflective member 18 may be formed partially flush with the lower face of the substrate 22. Here, the right and left end portions of the first reflective member 18 are in contact with the upper face of the substrate 22 while the end portion in the center in the longitudinal direction is flush with the lower face of the substrate 22. The lower face of the first reflective member 18 serves as both the inside and the outside of a through hole 22a as described above, thereby increasing the bonding area between the substrate 22 and the first reflective member 18, resulting in improvement of adhesion.

Figure 13B:
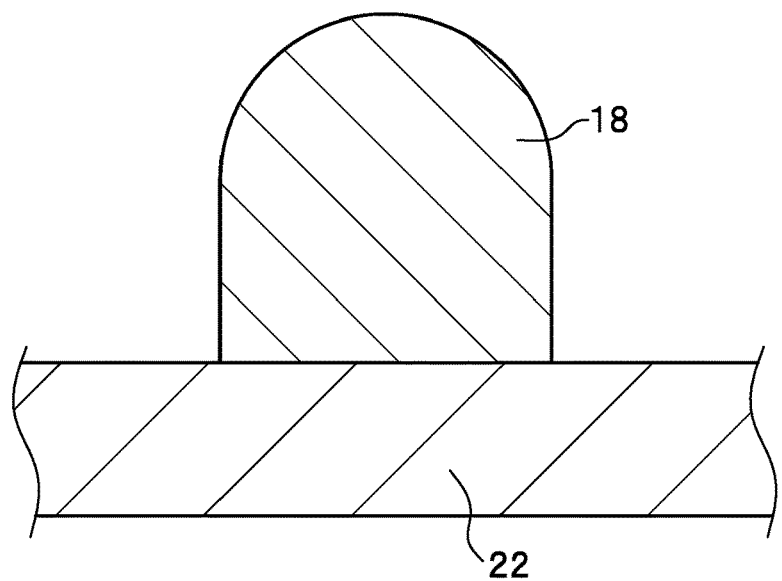
FIG. 13B is a partial sectional view of a first reflective member in a light emitting device which is another variation of the embodiments of the present disclosure.

Moreover, as shown in FIG. 13B, the first reflective member 18 may be disposed on the upper face of the substrate 22 without forming a through hole 22a in the substrate 22. By disposing the first reflective member 18 on the upper face of the substrate 22 in this manner, the amount of material used for the first reflective member 18 can be reduced as compared to the case where a through hole 22a is formed in the substrate 22.

Furthermore, the first reflective member 18 and the second reflective member 20 may be formed with different materials. The first reflective member 18, the second reflective member 20, and the third reflective member 36 may be formed with different reflective materials. Changing the reflective materials can facilitate the adjustment, for example, of the light extraction efficiency.

Furthermore, the light transmissive member 25 has been explained as including a phosphor layer 26 and a light transmissive layer 28, but it may be constructed with a light transmissive layer 28 alone, or a phosphor layer 26 alone.

The wavelength conversion substance (e.g., phosphor) used in the phosphor layer 26 can be those described above or those known in the art. Furthermore, the phosphor layer 26 may be disposed as a single layer or multiple layers. In the case of constructing the phosphor layer as multiple layers, the wavelength conversion substance may be changed per phosphor layer.

The first reflective members 18 may be disposed to surround the light emitting element. The first reflective members 18 may be away from all lateral faces of the light emitting element 16. This first reflective member 18 has opposing oblique or curved portions in the inner lateral faces which are slanted so that the distance therebetween increases towards the light transmissive member 25 from the side close to the substrate. In this way, the first reflective member 18 further facilitates extraction of the light emitted by the light emitting element 16 from the emission face, thereby improving the light extraction efficiency.

In this case, a substrate is prepared by also creating through holes along rows as in the case of the through holes 22a formed along columns.

In the method of manufacturing the light emitting device, the step of disposing light transmissive member S105 may be performed without performing the step of partially removing the first reflective members 18 and the light guide members 24 (S104). In the case of not performing the removal step (S104), it is preferable to dispose the light guide member 24 to the height of the upper ends of the first reflective members 18.

Furthermore, the step of forming the second grooves (S107) may be skipped while performing the operations through the step of separating into individual pieces (S109) only with the first grooves. In this case, reflectors capable of reflecting the light from the light emitting element 16 may be subsequently disposed on the front and rear lateral faces corresponding to the portions for the second grooves 34.

What is claimed is:

1. A light emitting device comprising:
    a substrate in a shape of rectangular,
    a light emitting element mounted on the substrate,
    a reflective member disposed outside one or more lateral sides of the light emitting element while being away from therefrom,
    a light guide member filling between inner faces of the reflective member so as to cover the light emitting element, and
    a light transmissive member disposed on the light guide member, wherein
    the reflective member includes at least one first reflective member opposite at least one lateral face of the light emitting element, and a second reflective member positioned outside the first reflective member and surrounds the light emitting element, wherein
    the at least one first reflective member has inner faces opposing each other, the inner faces each having an oblique or curved portion that are slanted so that a distance therebetween increases towards the light transmissive member from a side close to the substrate,
    the second reflective member covers lateral faces of the light transmissive member and outer lateral faces of the at least one first reflective member, and an upper face of the second reflective member is flush with an upper face of the light transmissive member.

2. The light emitting device according to claim 1, wherein a lower face of the at least one first reflective members is flush with a lower face of the substrate.

3. The light emitting device according to claim 1, wherein at least one portion of the at least one first reflective member is positioned on an upper face of the substrate.

4. The light emitting device according to claim 1, wherein the light transmissive member is positioned above an upper end of the at least one first reflective member.

5. The light emitting device according to claim 1, wherein the second reflective member has oblique faces opposing each other while being slanted so that a distance therebetween becomes smaller towards the light transmissive member from a side close to the substrate.

6. The light emitting device according to claim 1, wherein the at least one first reflective member and the second reflective member are formed using the same material.

7. The light emitting device according to claim 1, wherein the at least one first reflective member and the second reflective member are formed using different materials.

8. The light emitting device according to claim 1, wherein the second reflective member has a strength higher than a strength of the at least one first reflective member.

9. The light emitting device according to claim 1, wherein the second reflective member has a hardness higher than a hardness of the at least one first reflective member.

10. The light emitting device according to claim 1, wherein the light transmissive member includes a phosphor layer and a light transmissive layer stacked on the phosphor layer.

11. The light emitting device according to claim 1, wherein the reflective member further includes at least one third reflective member having oblique or curved inner faces opposing each other that are in contact with the inner faces of the at least one first reflective member and are slanted so that a distance therebetween becomes greater towards the light transmissive member from a side close to the substrate.

* * * * *